United States Patent
Twitchell, Jr. et al.

(10) Patent No.: US 8,726,478 B2
(45) Date of Patent: May 20, 2014

(54) METHOD OF CHANGING A POWER SOURCE FOR AN ELECTRONIC ASSEMBLY

(75) Inventors: Robert W. Twitchell, Jr., Cumming, GA (US); Richard Alan Clark, Alpharetta, GA (US)

(73) Assignee: Google Inc., Mountain View, CA (US)

( * ) Notice: Subject to any disclaimer, the term of this patent is extended or adjusted under 35 U.S.C. 154(b) by 832 days.

(21) Appl. No.: 12/962,866

(22) Filed: Dec. 8, 2010

(65) Prior Publication Data

US 2011/0072628 A1   Mar. 31, 2011

Related U.S. Application Data

(63) Continuation of application No. 12/507,017, filed on Jul. 21, 2009, now abandoned, which is a continuation of application No. 11/423,127, filed on Jun. 8, 2006, now Pat. No. 7,563,991.

(60) Provisional application No. 60/688,737, filed on Jun. 8, 2005.

(51) Int. Cl.
   *B23P 6/00* (2006.01)
(52) U.S. Cl.
   USPC ............... 29/402.08; 29/426.2; 29/825
(58) Field of Classification Search
   USPC ................... 29/402.08, 426.2, 825
   See application file for complete search history.

(56) References Cited

U.S. PATENT DOCUMENTS

| 4,799,898 | A * | 1/1989 | Schick ............... 439/418 |
| 7,563,991 | B2 | 7/2009 | Twitchell, Jr. et al. |
| 2009/0283320 | A1 | 11/2009 | Twitchell, Jr. et al. |
| 2010/0214061 | A1 | 8/2010 | Twitchell, Jr. et al. |

OTHER PUBLICATIONS

Information Disclosure Statement (IDS) Letter Regarding Common Patent Application(s), dated Nov. 30, 2011.

* cited by examiner

*Primary Examiner* — Carl Arbes
(74) *Attorney, Agent, or Firm* — Morris & Kamlay LLP

(57) ABSTRACT

An all weather housing assembly for protection of electrical components includes a first housing having an open end and defining a first compartment for receipt therein of electronic components; a cover attached to the first housing for enclosing the first compartment, the cover further including a mounting structure for receiving and retaining a power source which structure is mounted on a side of the cover that is exterior to the enclosed first compartment; and a second housing having an open end and defining a second compartment that is dimensioned to cover and protect a power source when received and retained by the mounting structure of the cover, the second housing being connected to the first housing independent of the attachment of the cover to the first housing.

14 Claims, 7 Drawing Sheets

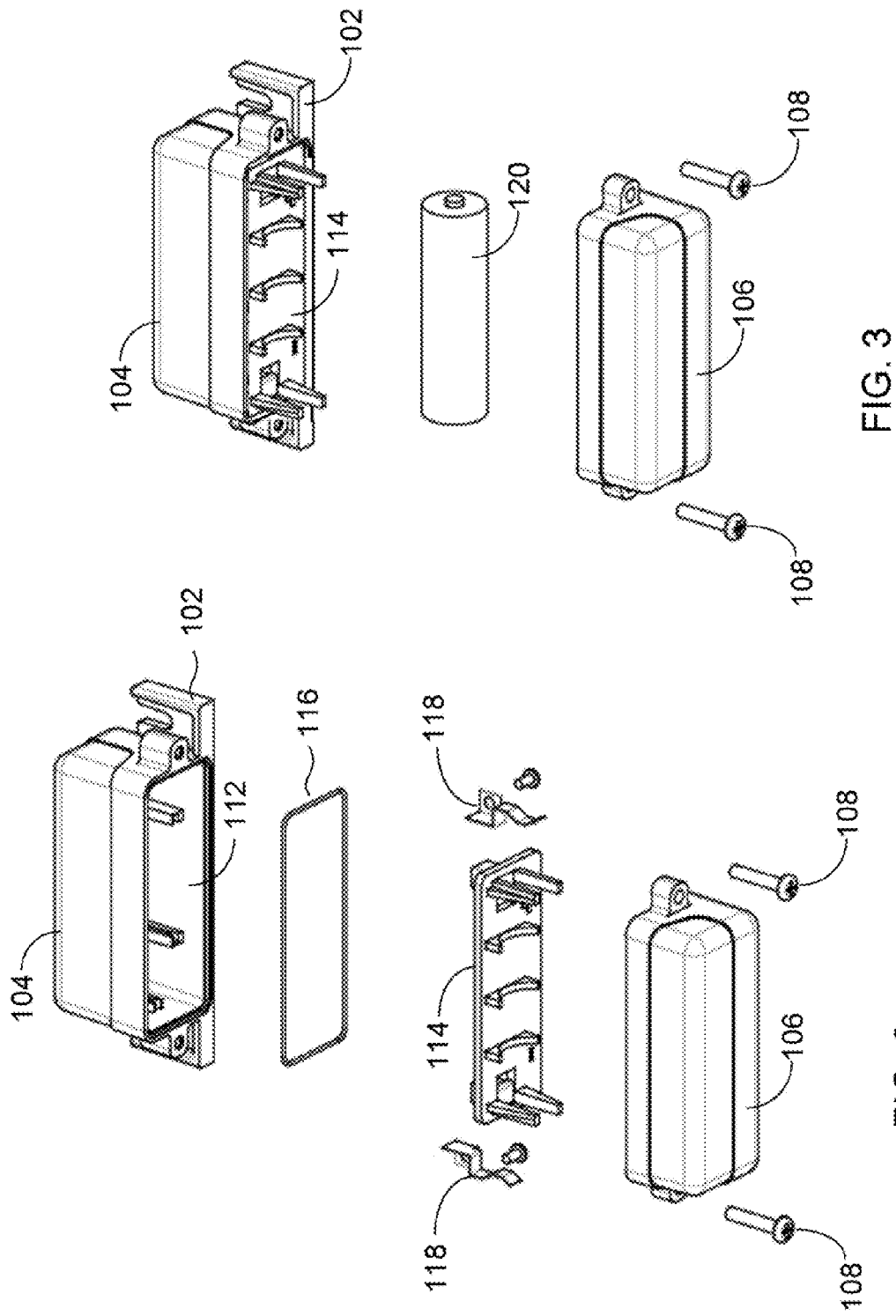

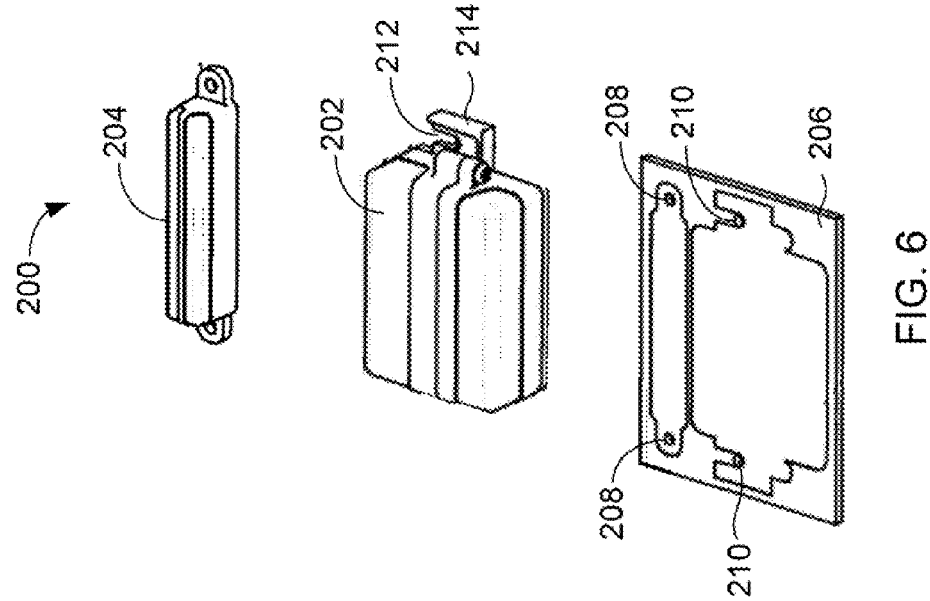
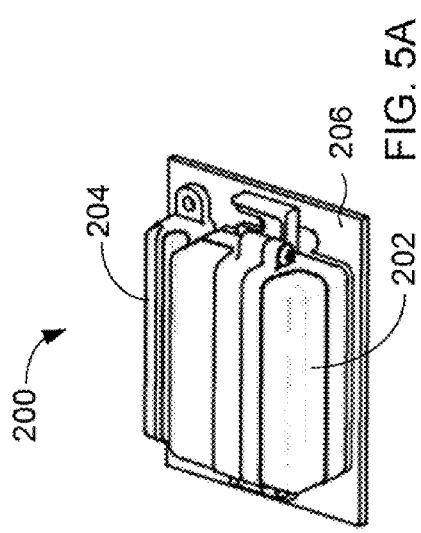
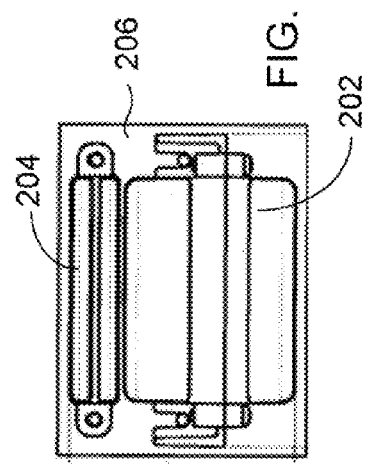
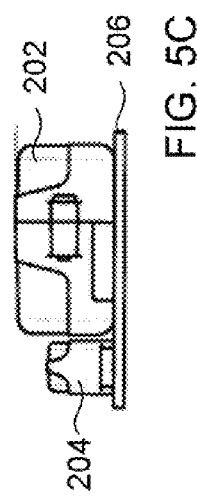

US 8,726,478 B2

METHOD OF CHANGING A POWER SOURCE FOR AN ELECTRONIC ASSEMBLY

I. CROSS-REFERENCE TO RELATED APPLICATIONS

The present application is a U.S. continuation patent application of, and claims priority under 35 U.S.C. §120 to, U.S. Nonprovisional patent application Ser. No. 12/507,017, filed Jul. 21, 2009 now abandoned, which '017 application published as U.S. Patent Application Publication No. 2009/0283320 on Nov. 19, 2009, which '017 application and '320 publication are each hereby incorporated herein by reference, and which '017 application is a U.S. continuation patent application of, and claims priority under 35 U.S.C. §120 to, U.S. Nonprovisional patent application Ser. No. 11/423,127, filed Jun. 8, 2006, which '127 application published as U.S. Patent Application Publication No. 2006/0289204 on Dec. 28, 2006 and issued as U.S. Pat. No. 7,563,991 on Jul. 21, 2009, which '127 application, '204 publication, and '991 patent are each hereby incorporated herein by reference, and which '127 application is a nonprovisional of, and claims priority under 35 U.S.C. §119(e) to Twitchell, U.S. Provisional Patent Application No. 60/688,737 filed Jun. 8, 2005. The entire disclosure of this provisional patent application is hereby incorporated herein by reference.

The present application further hereby incorporates by reference each of: U.S. Pat. No. 6,753,775 B2; U.S. Pat. No. 6,745,027 B2; U.S. Pat. No. 6,665,585 B2; U.S. Pat. No. 5,458,042; International Patent Application Publication No. WO 03/032501 A2 (designating the United States and published in English); International Patent Application Publication No. WO 03/098851 A1 (designating the United States and published in English); U.S. Patent Application Publication No. 2004/0082296 A1; U.S. Patent Application Publication No. 2004/0183673 A1; and U.S. Patent Application Publication No. 2004/0021572 A1.

II. COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

III. BACKGROUND OF THE INVENTION

The present invention generally relates to an assembly comprising a remote sensor interface (RSI). RSIs are utilized for remotely collecting data in the field and communicating the collected data to one or more centralized locations. For example, RSIs are utilized in tracking and monitoring assets that are stored and/or transported in association with wireless transceivers, such as radio frequency identification tags (RFIDs). In such implementations, an RSI has been previously referred to as a wireless reader tag or WRT. The data regarding the tracked and monitored assets is communicated by an RSI to one or more central servers for processing. Such data is useful, for instance, in supply chain management. Such data further is useful, for instance, in homeland security, especially when the assets being tracked and monitored are being imported into the United States from foreign countries.

Of course, the RSI of the present invention preferably is capable of wireless communications with external devices. For example, the RSI preferably communicates with other RSIs in forming one or more wireless networks. Furthermore, the RSI preferably communicates with a gateway that itself serves as a bridge to other networks, such as the Internet, a cellular network, or a Satellite network.

The present invention relates in particular to an assembly of an RSI that includes a first housing having an internal compartment for electronic components and a second housing for receiving power source components. The housing for power source components is capable of being opened separately from the housing for the electronic components for protection of the electronic components when the power source components are serviced or replaced. For example, a battery of an RSI can be replaced without exposure of electronic components thereof to an outdoor and potentially harsh environment such as that of a sea port, the deck of a sea vessel, a railroad yard, or a truck loading area.

IV. BRIEF DESCRIPTION OF THE DRAWINGS

One or more embodiments of the present invention will be described in detail with reference to the accompanying drawings which are briefly described below, wherein the same elements are referred to with the same reference numerals, and wherein various elements are not necessarily shown in conformance to any particular absolute or relative scale.

FIG. 2 is an exploded perspective view of the RSI of FIG. 1A.

FIG. 3 is a partially exploded perspective view of the RSI of FIG. 1A with a battery.

FIG. 5A is a perspective view of a wireless magnetic seal kit according to a preferred embodiment of the invention.

FIG. 5B is a top plan view of the wireless magnetic seal kit of FIG. 5A.

FIG. 5C is a side elevational view of the wireless magnetic seal kit of FIG. 5A.

FIG. 6 is a partially exploded perspective view of the wireless magnetic seal kit of FIG. 5A.

V. DETAILED DESCRIPTION

Figure 1A:
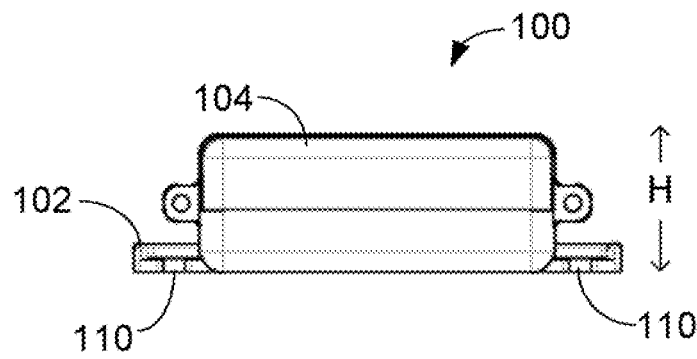
FIG. 1A is a front elevational view of a remote sensor interface (RSI) according to an embodiment of the invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at lease one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Figure 1B:
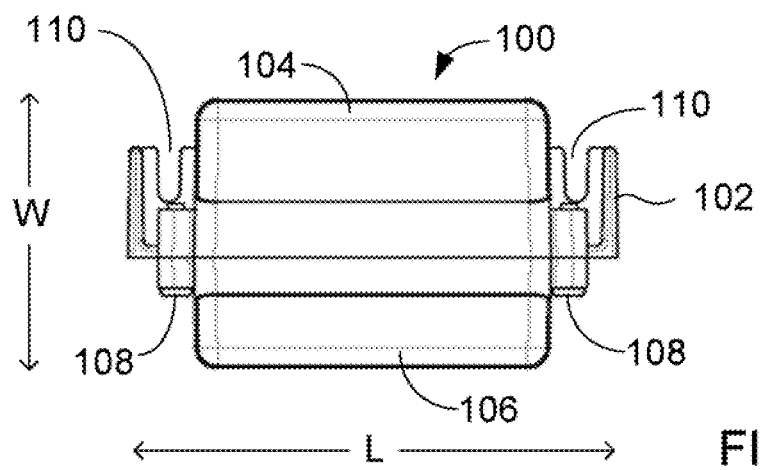
FIG. 1B is a top plan view of the RSI of FIG. 1A.
Figure 1C:
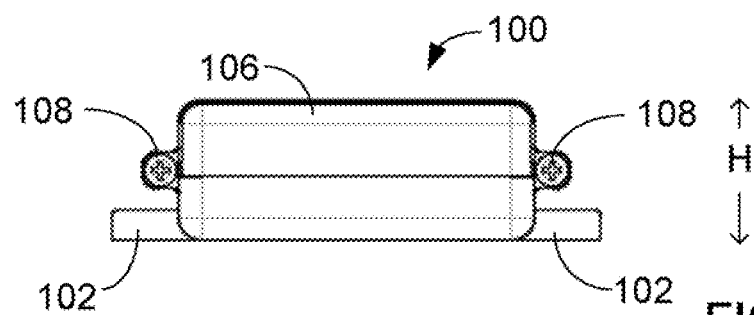
FIG. 1C is a back elevational view of the RSI of FIG. 1A.

Turning now to FIGS. 1A-1C, in a preferred embodiment of the invention, a remote sensor interface (RSI) 100 includes a base 102, a first housing 104 attached to the base, and a second housing 106 connected to the first housing 104 by connectors 108. The second housing 106 is capable of being opened separately from the first housing 104. For example, in the embodiment illustrated in FIG. 1, the connectors 108 are threaded screws that can be removed to allow the second housing to be separated from the first housing. Slots 110 are formed in the base 102 for attaching or otherwise mounting of the RSI 100 to a structure such as a wall. For example, various connectors such as screws, bolts, rivets, and nails can be passed through the slots and attached to a surface upon which the RSI is to be mounted.

In the embodiment illustrated in FIG. 1A-1C, the RSI 100 has outer dimensions of length (L), width (W), and height (H). Though it should be appreciated that the descriptions herein and the accompanying drawings are not limited to any particular scale or dimension, the RSI 100 described herein as an exemplary embodiment has an approximate length of 3.3 inches, an approximate width of 2.4 inches, and an approximate height of 1.0 inch.

As shown in FIG. 2, the first housing 104 defines a first compartment 112 that is capable of being closed and sealed. Closure and sealing of the first compartment 112 is obtained by pressing a cover 114 into engagement with the first housing 104 with the seal 116 between the cover and first housing. In the illustrated embodiment, the seal is a pliable gasket received by a channel of the first housing and retained therein by the cover when the cover is engaged with the first housing in a press fit engagement. The engagement of the cover with the first housing can be further supported by an adhesive or connectors such as clips or screws. The first housing 104 and cover 114 are engaged in FIG. 3 such that closure and sealing of the first compartment is obtained.

As further shown in FIG. 2, electrical contacts 118 are provided for conducting electrical current from a power source to the interior of the first compartment 112. Furthermore, the cover 114 is formed to receive a power source 120, such as a battery, such that the electrical contacts 118 conduct electrical current from the power source, through the cover 114, and into the closed and sealed first compartment when the cover 114 and first housing 104 are engaged as shown in FIG. 3. Moreover, the second housing is dimensioned to cover and protect the power source when the second housing 106 is connected to the first housing 104 (FIG. 1).

In the illustrated embodiment, the cover 114 is particularly formed to receive a standard AA battery having opposing positive and negative terminals; the electrical contacts 118 are formed and disposed to contact the opposing terminals of the battery; and, the second housing 106 is dimensioned to cover and protect the AA battery. It should be appreciated, however, that in other embodiments according to the invention, other battery sizes and power sources can be accommodated by differently shaped and configured cover, electrical contacts, and second housing, as desired, so long as such elements are designed for sealing engagement with the first housing 104.

Various electronic components optionally are disposed within the first compartment 112. The electronic components are powered by the power source 120 by way of the electrical contacts 118. The electronic components are sealed and protected between the first housing 104 and cover 114 when closure and sealing of the first compartment is obtained as shown in FIG. 3. Sealing and closure of the first compartment is not lost when the second housing 106 is separated from the first housing 104. Thus the power source 120 can be routinely serviced or replaced without disturbing the first compartment and without exposing any electronic components within the first compartment to potentially harsh external conditions. For example, insofar as the RSI 100 is attached to a land-sea container on the deck of a cargo ship, the battery of the RSI can be replaced without exposing the electronic components of the RSI to moisture and corrosive salty conditions.

Figure 4:
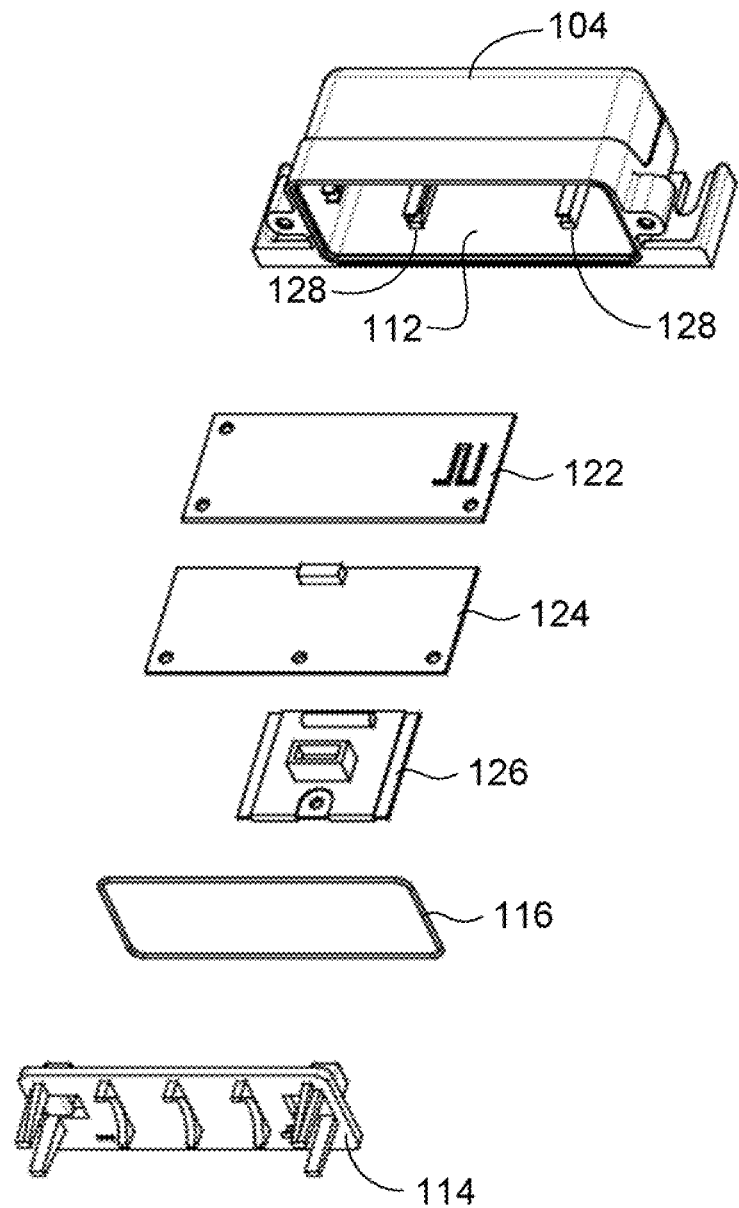
FIG. 4 is a perspective view of a first housing, seal, and cover of the RSI of FIG. 1A, shown with optional electronic components.

Several exemplary electronic components are shown in FIG. 4 as printed circuit assembly (PCA) cards, which preferably include printed circuit boards. A first PCA card 122 preferably includes components comprising a wake-up receiver circuit for receiving wireless wake-up signals and prompting wake up of the RSI. The components of the wake-up receiver circuit include an etched antenna on the printed circuit board of the PCA card. The wake-up receiver circuit preferably has a relatively low power consumption rate compared to that of a standards based radio of the RSI. Furthermore, the wake-up receiver circuit preferably executes a stepped wake up sequence for minimizing power consumption of the RSI to avoid frequent power source servicing such as the changing of a battery.

Another PCA card 124 preferably includes a standards based radio for two-way wireless communications with one or more gateways and/or one or more other RSIs. Such standards based radio preferably comprises a Bluetooth radio or WiFi radio. The PCA card 124 preferably communicates with a gateway for receiving commands, communicating data acquired via its sensors, and/or forwarding data collected and communicated from another RSI. In this regard, the PCA card 124 preferably is used by the RSI in forming ad-hoc networks and in relaying communications between other RSI units and a gateway.

As further shown in FIG. 4, a PCA card 126 comprising a sensor interface also is provided for acquiring data from one or more sensors associated with the RSI. Insofar as the RSI is associated with assets, such as shipping containers and contents thereof, the RSI preferably is capable of interfacing with sensors that, for example, monitor the assets, environmental characteristics of the assets, and/or geographical locations of the assets. In some embodiments, the sensor is included within the RSI, as in the example of FIGS. 5-7; in other embodiments, the sensor is external to the RSI but nevertheless disposed in electronic communication with the sensor interface for data exchange there between. Electronic communication between the sensor interface and a sensor is exchanged wirelessly in some embodiments of the invention and by way of cabled connections in other embodiments. In at least one embodiment, the sensor interface comprises a multi-conductor connector, such as a ribbon cable, that passes from the interior of an RSI and to an external sensor, sensor array, or docking station that receives the RSI. Exemplary sensors include, but are not limited to, electronic seals, magnetic seals, cameras, microphones, temperature sensors, humidity sensors, radiation sensors, and motion sensors.

Each PCA card 122,124,126 of FIG. 4 has a number of electrical contacts (not shown) corresponding to electrical contacts of the first housing 104. In assembling the RSI, each card is pressed into an available card slot in the first compartment 112 of the first housing 104 with the electrical contacts of the card abutting corresponding electrical contacts of the first housing 104. The cards are physically supported by rails within the first compartment when pressed into an available slot. For example, rails 128 for receiving and supporting the PCA card 126 comprising the sensor interface are visible in FIG. 4. Accordingly, it will be appreciated that each PCA card is easily installed and removed for replacement, upgrade, or servicing, much like card components of a personal computer.

When the PCA cards 122,124,126 of FIG. 4 are installed within the first compartment 112, and the cover 114 and first housing 104 are engaged with the seal 116 therebetween, closure and sealing of the first compartment is obtained. Servicing or replacing of the battery 120 is possible, as shown in FIG. 3, without removing the cover from engagement with the first housing 104.

Turning now to an illustrative example according to a preferred embodiment of the invention, as shown in FIGS. 5A-5C and FIG. 6, a wireless magnetic seal kit 200 includes an RSI 202, a magnet housing 204, and a mounting template 206. The RSI 202 includes at least a PCA card 124 comprising a standards based radio as shown in FIG. 4, and a PCA card 126 comprising a sensor interface that includes, in this particular embodiment, a magnetic field sensor. The magnet housing 204 includes a magnet having a magnetic field. Close proximity of the magnet housing 204 to the RSI 202, as shown in FIG. 5C, may be indicative of, for example, the presence of a monitored asset, or the closure of a monitored door, cover, or window. Conversely, removal of the magnet housing 204 from close proximity to the RSI may be indicative of, for example, the loss of presence of a monitored asset, or the opening of a monitored door, cover, or window. Moreover, removal of the magnet housing from close proximity to the RSI is an event detected by the magnetic field sensor of the sensor interface of the RSI, and such event may be evidence that, for example, a monitored asset has been lost or subjected to tampering, or that a monitored door, cover, window, closure, or seal has been opened, compromised, or defeated. Detection of such an event preferably results in the RSI reporting the event to a central location via one or more RSIs and/or a gateway. Furthermore the RSI may promptly send a signal reporting the event, or the RSI may record the event for later reporting, particularly if the RSI is out of communication range with one or more RSIs and/or a gateway.

The mounting template 206 of the kit 200 is provided to facilitate convenience in mounting the RSI 202 and magnet housing 204 onto respective surfaces. Guide holes 208 formed in the template 206 correspond to mounting holes formed in the magnet housing 204. Guide holes 210 formed in the template correspond to the slots 212 formed in the base 214 of the RSI 202. The guide holes of the template are useful to guide a marking pen or drill bit so that respective surfaces upon which the RSI and magnet housing are to be mounted can be pre-drilled with holes for receiving mounting connectors such as screws, bolts, or rivets. Once such holes are formed, the RSI and magnet housing are mounted to the respective surfaces.

Figure 7A:
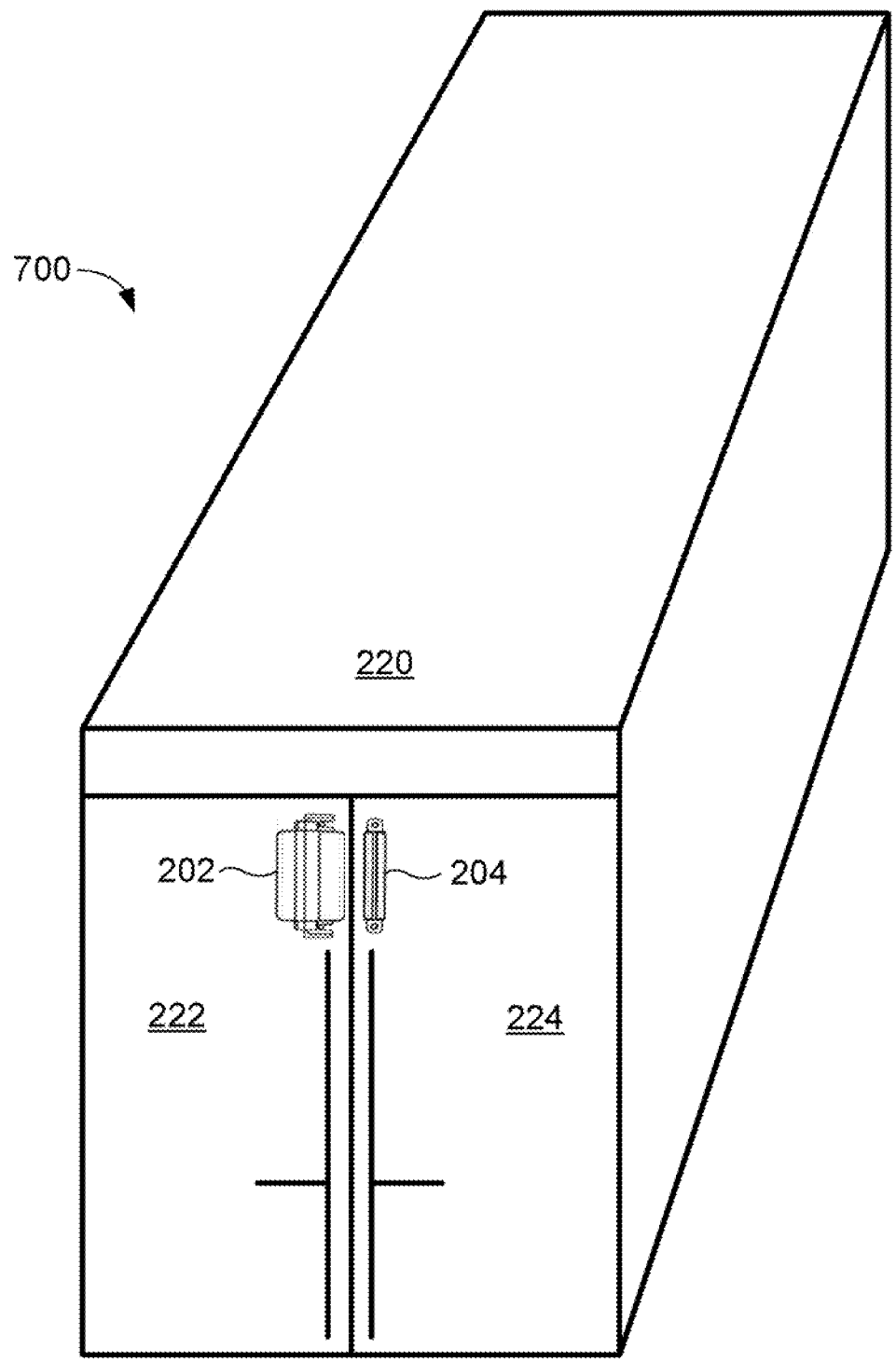
FIG. 7A illustrates an embodiment of a shipping container including the RSI and the magnet housing of the kit of FIG. 5A.

Continuing in the illustrative example, in FIG. 7A, which is not intended to be drawn to scale, an embodiment 700 in accordance with the invention includes an RSI 202 mounted to a first door 222 of a container 220, such as a maritime or land-sea shipping container. A magnet housing 204 is mounted to a second door 224. So long as the doors remain closed, close proximity of the magnet housing to the RSI is maintained. However, if either door is opened, close proximity of the magnet housing to the RSI is lost and opening of the door is detected by the RSI, and the detection preferably is reported to an external device such as a gateway.

Figure 7B:
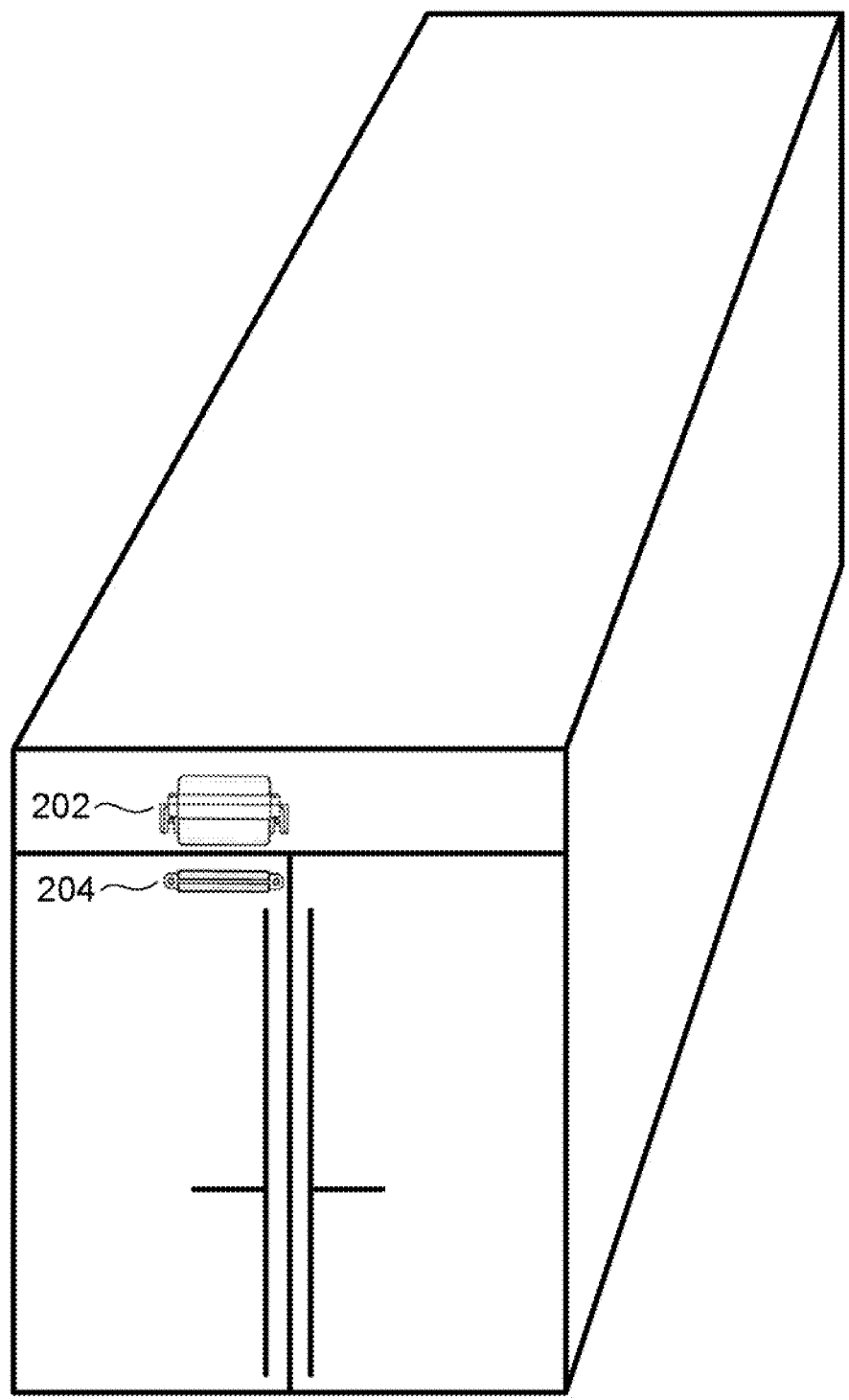
FIG. 7B illustrates a shipping container and an RSI in an arrangement alternative to that of FIG. 7A.

In another illustrative arrangement, in FIG. 7B, the RSI 202 is mounted to a frame member of a shipping container and the magnet housing 204 is mounted to a door of the container. In this arrangement, the RSI 202 remains stationary as the door is opened and closed, thus fatigue of the RSI 202 by mechanical vibration is minimized. In yet another arrangement, an RSI is mounted within a container and thus is sheltered from environmental conditions external to the container.

Figure 8:
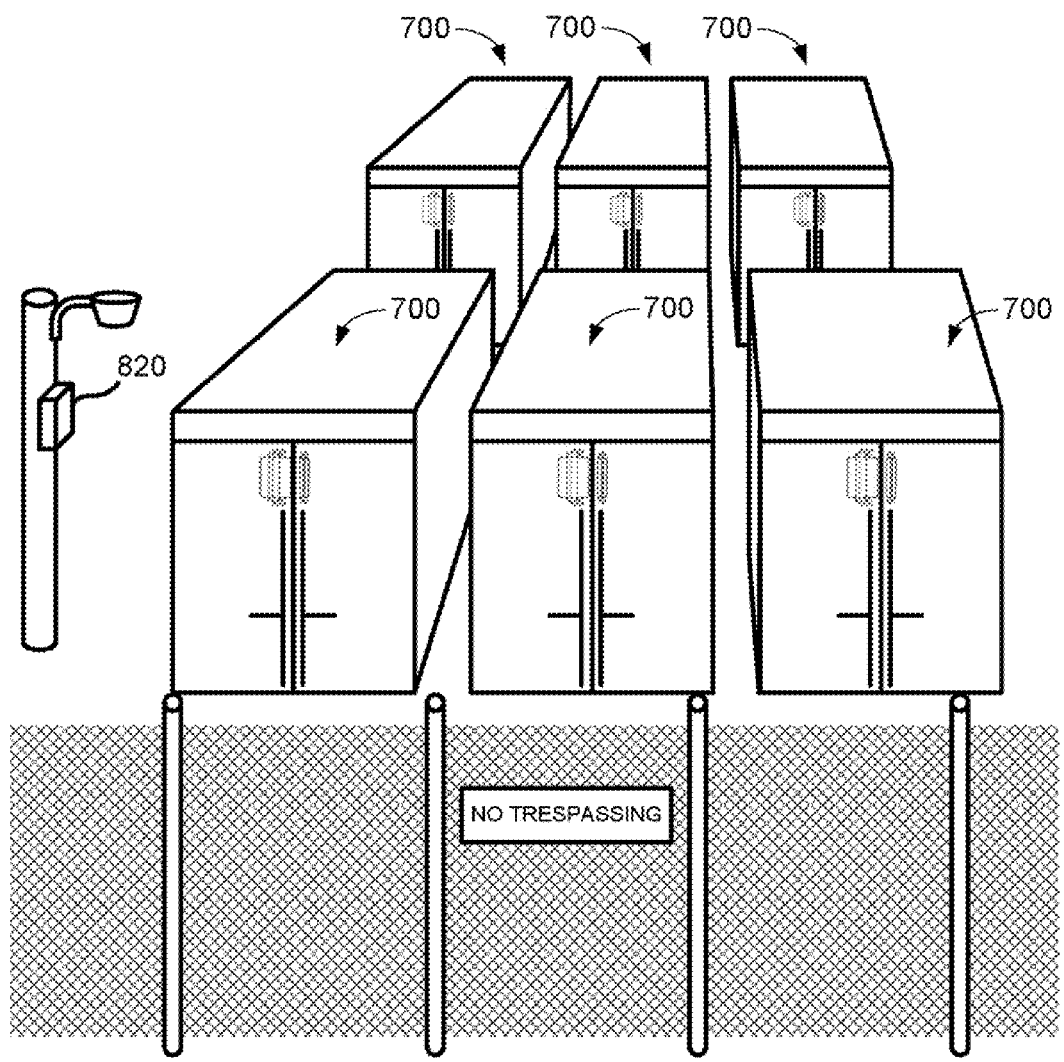
FIG. 8 illustrates a shipping yard including a plurality of the shipping containers of FIG. 7A.

A shipping yard including a plurality of embodiments 700 according to FIG. 7A is illustrated in FIG. 8. As will be appreciated, each RSI monitors the state of its respective shipping container, i.e., whether the container is closed or open, and/or whether the state has changed, i.e., whether the container has been closed or opened. Further data monitoring may include the time period in which the container is in a particular state. Each RSI communicates wirelessly via the standards based radio of its respective PCA card 124 with one or more other RSIs and/or the gateway 820, which gateway 820 preferably is disposed in electronic communication with a wide area network, such as the Internet, a Satellite network, and/or a cellular network. In this regard, the gateway 820 may be connected via wire or cable, or wirelessly, to the wide area network.

Based on the foregoing description, it will be readily understood by those persons skilled in the art that the present invention is susceptible of broad utility and application. Accordingly, while one or more embodiments of the present invention have been described herein in detail, it is to be understood that this disclosure is only illustrative and exemplary and is made merely for the purpose of providing a full and enabling disclosure of the invention. The foregoing disclosure is not intended to be construed to limit the present invention or otherwise exclude any other embodiments, adaptations, variations, modifications or equivalent arrangements, the scope of the invention being limited only by the claims of an issued patent and the equivalents thereof.

What is claimed is:

1. A method for changing a power source of an electronic assembly mounted to a structure or asset without exposing an electronic device of the electronic assembly to environmental conditions at the structure or asset, the electronic assembly comprising a sealed first housing having the electronic device disposed therein, and a second housing, which has a first power source therein, connected to the first housing, the method comprising:
    (a) effecting opening of the second housing such that the first housing remains sealed to environmental conditions at the structure or asset;
    (b) removing the first power source;
    (c) installing the second power source;
    (d) effecting closing of the second housing;
    (e) wherein, following performance of said steps, the electronic device is powered by the second power source.

2. The method of claim 1, wherein the first and second power sources each comprise a battery.

3. The method of claim 1, wherein the electronic device comprises a radio capable of receiving a wireless signal.

4. The method of claim 1, wherein the electronic assembly further includes a base having slots formed therein for mounting the electronic assembly to a structure or asset.

5. The method of claim 1, wherein the electronic assembly is configured to monitor one or more conditions of the asset or structure the weather housing assembly is mounted to.

6. A method for changing a power source of a weather housing assembly for protection of electrical components, the housing assembly including a first housing having an open end and defining a first compartment having electronic components therein, a cover attached to the first housing for enclosing the first compartment, the cover further including a mounting structure for receiving and retaining a power source which structure is mounted on a side of the cover that is exterior to the enclosed first compartment, and a second housing having an open end and defining a second compartment that is dimensioned to cover and protect a power source when received and retained by the mounting structure of the cover, the second housing being connected to the first housing independent of the attachment of the cover to the first housing, the method comprising:
    (a) separating the second housing from the first housing so as to provide access to the second compartment;
    (b) removing a first power source received and retained by the mounting structure of the cover;
    (c) installing a second power source such that it is received and retained by the mounting structure of the cover; and
    (d) connecting the second housing to the first housing so as to prevent access to the second compartment;
    (e) wherein, following performance of said steps, the electronic device is powered by the second power source.

7. The method of claim 6, wherein the second housing is connected to the first housing by connectors, the connectors comprising threaded screws, and wherein said step of separating the second housing from the first housing comprises removing the threaded screws.

8. The method of claim 6, wherein the first and second power sources each comprise a battery.

9. The method of claim 6, wherein the electronic components comprises a radio capable of receiving a wireless signal.

10. The method of claim 6, wherein the weather housing assembly further includes a base having slots formed therein for mounting the weather housing assembly to a structure or asset.

11. The method of claim 6, wherein the weather housing assembly is mounted to a structure or asset.

12. The method of claim 6, wherein the electronic components comprise a printed circuit assembly (PCA) card, the PCA card being physically supported within the first housing by rails of the first housing, opposite sides of the PCA card being received and retained by the rails.

13. The method of claim 6, wherein the electronic components comprise a sensor interface for acquiring data from one or more sensors associated with the weather housing assembly.

14. The method of claim 6, wherein the electronic components are configured to monitor one or more conditions of an asset or structure the weather housing assembly is attached to.

* * * * *